(12) United States Patent
Lee

(10) Patent No.: US 7,523,374 B1
(45) Date of Patent: Apr. 21, 2009

(54) METHOD AND APPARATUS FOR INITIAL BCH DECODING IN A WCDMA SYSTEM

(75) Inventor: Kah Yong Lee, Union City, CA (US)

(73) Assignee: National Semiconductor Corporation, Santa Clara, CA (US)

(*) Notice: Subject to any disclaimer, the term of this patent is extended or adjusted under 35 U.S.C. 154(b) by 973 days.

(21) Appl. No.: 10/441,900

(22) Filed: May 19, 2003

(51) Int. Cl.
*H03M 13/00* (2006.01)
*H04B 1/00* (2006.01)

(52) U.S. Cl. .................. 714/752; 714/776; 370/335; 370/342

(58) Field of Classification Search ............. 370/229, 370/231, 235, 335, 342; 714/747–748, 752, 714/776, 822
See application file for complete search history.

(56) References Cited

U.S. PATENT DOCUMENTS 6,938,195 B1*  8/2005  Shi et al. .................. 714/748
7,177,654 B2*  2/2007  Stenberg .................. 455/458
2003/0035389 A1*  2/2003  Chen et al. ................ 370/331
2003/0139140 A1*  7/2003  Chen et al. ................ 455/67.1

* cited by examiner

*Primary Examiner*—Lee Nguyen

(57) ABSTRACT

When an initial frame alignment during decoding of multi-frame data segments fails a cyclic parity check, a portion of the received data is retained and reused for a second decode attempt using a different frame alignment. For BCH data transmitted within a WCDMA system, the second of two frames received and failing a parity check on decode is retained and coupled with a third received frame for a second decode attempt. When incorrect frame alignment is the cause of failure of the first decode attempt, the correct frame alignment should be achieved using the second and third received frames. Recovery from initial incorrect frame alignment is thus quicker than systems discarding all data from the first decode attempt.

20 Claims, 3 Drawing Sheets

METHOD AND APPARATUS FOR INITIAL BCH DECODING IN A WCDMA SYSTEM

TECHNICAL FIELD OF THE INVENTION

The present invention is directed, in general, to decoding multi-frame data and, more specifically, to decoding a cyclic parity coded data segment transmitted across two frames when incorrect frame alignment is initially selected.

BACKGROUND OF THE INVENTION

Broadcast Channel (BCH) data in wideband code division multiple access (WCDMA) systems is transmitted in 20 milli-second (ms) segments, whereas each radio frame of a WCDMA system is 10 ms long. Since BCH data must therefore be transmitted in two WCDMA radio frames, the chances of getting the correct frame alignment during decoding is 50%.

Failure of decoded data to satisfy the parity check may indicate incorrect frame alignment. Existing BCH decoding schemes for WCDMA systems typically assume that a decoding error may have resulted from signal distortion during transmission (e.g., multi-path interference), either in lieu of or in addition to incorrect frame alignment. Such systems generally discard the received data and restart with a frame, based on timing, which should provide correct frame alignment if incorrect alignment was at least partially responsible for the initial decoding failure. However, this may require as many as nine frames before decoding may be successfully undertaken on received frames.

There is, therefore, a need in the art for improved BCH decoding providing faster recovery from incorrect initial frame alignment.

SUMMARY OF THE INVENTION

To address the above-discussed deficiencies of the prior art, it is a primary object of the present invention to provide, for use in a WCDMA wireless communications system, a decode controller that, when an initial frame alignment during decoding of multi-frame data segments fails a cyclic parity check, retains a portion of the received data for reuse in a second decode attempt using a different frame alignment. For BCH data transmitted within a WCDMA system, the second of two frames received and failing a parity check on decode is retained and coupled with a third received frame for a second decode attempt. When incorrect frame alignment is the cause of failure of the first decode attempt, the correct frame alignment should be achieved using the second and third received frames. Recovery from initial incorrect frame alignment is thus quicker than systems discarding all data from the first decode attempt.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 2A-2B, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
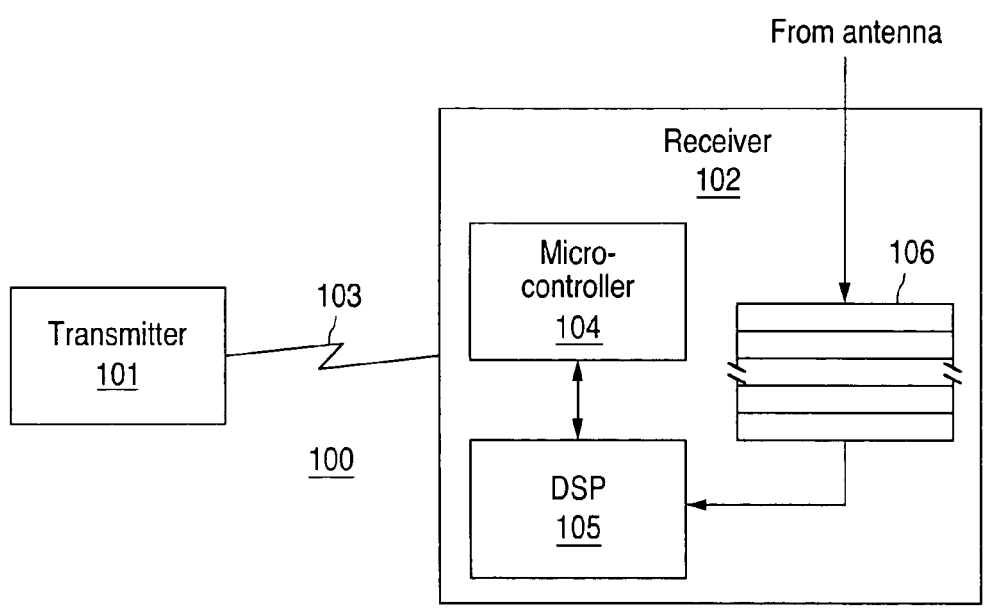
FIG. 1 depicts a wireless communications system including a receiver handling incorrect initial frame alignment during BCH decoding according to one embodiment of the present invention.

FIG. 1 depicts a wireless communications system including a receiver handling incorrect initial frame alignment during BCH decoding according to one embodiment of the present invention. Wireless communication system 100 includes a transmitter 101 and a receiver 102 communicably coupled by a wireless communications channel 103. Transmitter 101 may be a wireless base station, while receiver 102 is a mobile unit, or vice versa. Wireless communications system 100 is preferably a WCDMA system transmitting BCH data, with each BCH data segment transmitted across two WCMDA frames as described above.

Those skilled in the art will recognize that the full construction and operation of a wireless communications system is not depicted in the drawings or described herein. Instead, for simplicity and clarity, only so much of a wireless communications system as is unique to the present invention or necessary for an understanding of the invention is depicted and described.

In the exemplary embodiment, receiver 102 includes a microcontroller 104, a digital signal processor (DSP) 105, and an input buffer 106 receiving wireless signal samples that have been pre-processed for, for example, channel equalization. DSP 105 performs BCH decoding on sample pairs within input buffer 106, transmitting signals to microcontroller 104, in the manner described in further detail below.

Figure 2A:
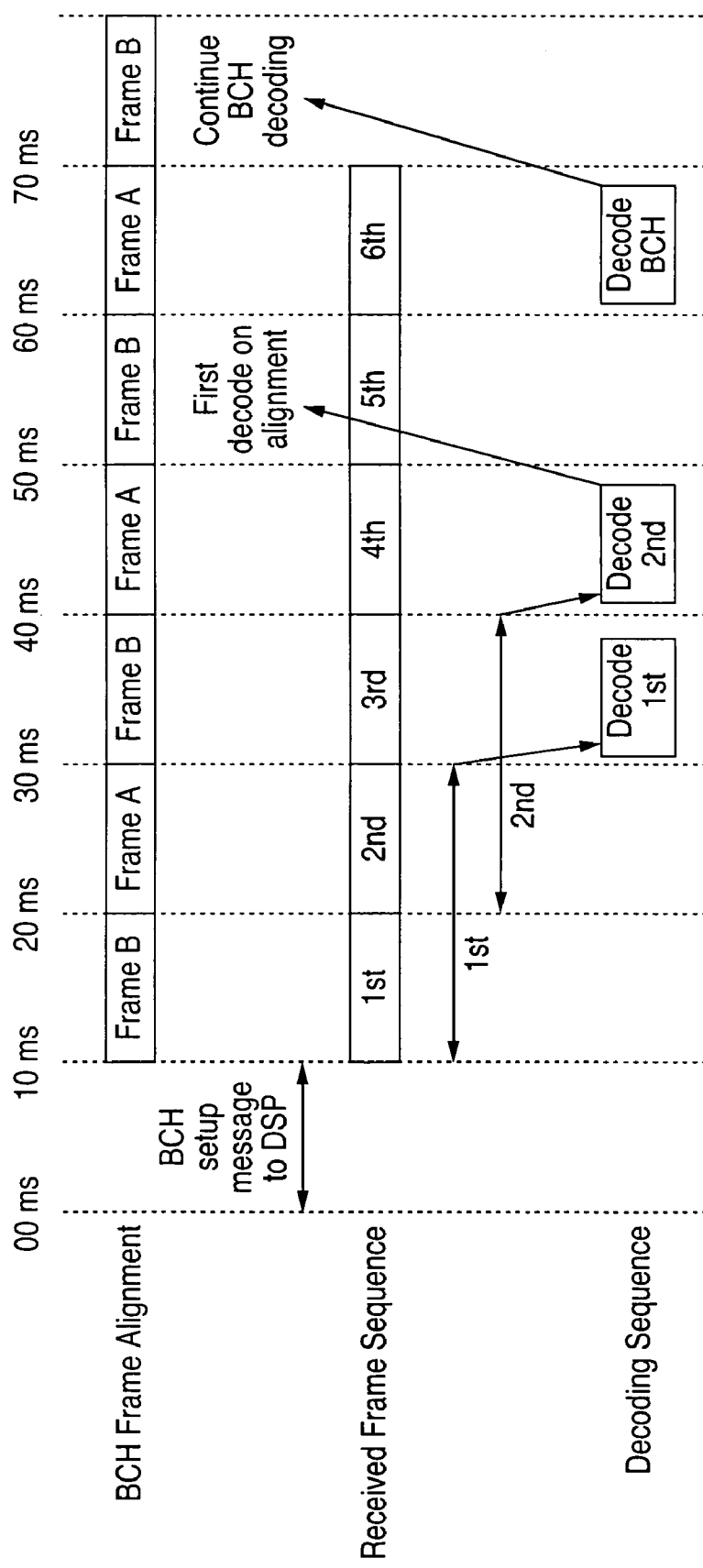
FIGS. 2A and 2B are timing diagrams illustrating handling incorrect initial frame alignment during BCH decoding according to one embodiment of the present invention.
Figure 2B:
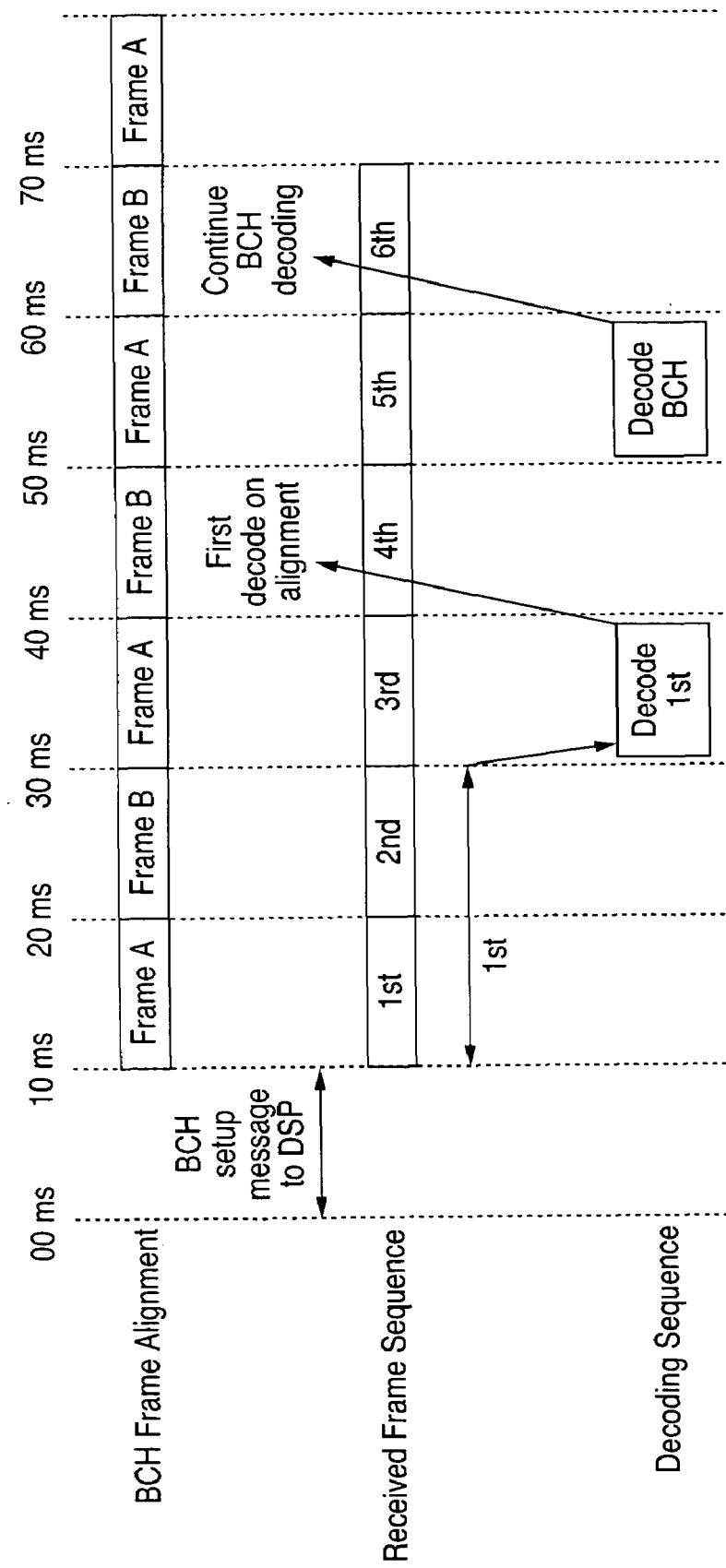

FIGS. 2A and 2B are timing diagrams illustrating handling incorrect initial frame alignment during BCH decoding according to one embodiment of the present invention. The processes illustrated are performed within receiver 102. The BCH frame alignment is indicated by the top trace, where frame A represents the first frame of a two-frame encoded data segment, and frame B represents the second frame. Messages between DSP 105 and microcontroller 104 are shown in the second trace, while the sequence of received frames is shown in the third trace and decode results are depicted at the bottom.

Once reception and decoding are initiated, BCH setup messages are sent to the DSP 105, as shown in the first frame period. The first and second frames received are then decoded together during the third frame period after reception and decoding is initiated. The worst case selection of initial frame alignment possible, where the first frame received and decoded is a frame B or the second of two frames for a given data segment, is depicted in FIG. 2A.

Because the incorrect initial frame alignment was selected, the parity check will fail during decoding of the first two frames received in FIG. 2A. Rather than discarding both frames as in conventional systems, however, receiver 102 discards only the first frame and retains the second frame. The second and third received frames are then decoded together during the fourth frame period. Since the frame alignment is now correct, the parity check will not fail and the frames will be successfully decoded. A message is sent by the DSP 105 that the first decode on alignment has been achieved.

The fourth and fifth received frames are then decoded together during the sixth frame period. Again, since the selected frame alignment is correct, the parity check will not fail due to incorrect frame alignment and the decode should be successful absent corruption due to channel conditions or the like. A message is then sent by the DSP 105 that BCH decoding will continue on all subsequent received frame pairs.

FIG. 2B illustrates, for comparative purposes, best case selection of initial frame alignment, where the first frame received and decoded is a frame A or the first of two frames for a given data segment. The first frame pair received and decoded after BCH setup will not fail the parity check due to incorrect frame alignment, which will prompt transmission of a message by the DSP 105 that the first decode on alignment has been successfully achieved.

Rather than discard all frame data when a parity check fails during start to reception and decoding, part of the frame data is retained and employed using a different alignment. The parity check failure is thus assumed to be due to incorrect frame alignment. If corruption due to channel conditions exists, several successive frame pair decode attempts are likely to fail the parity check. The present invention thus recovers from an initial incorrect frame alignment quicker than if all received frames were discarded and decode restarted after receipt of two complete additional frames.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A portion of a wireless receiver comprising:
    a decode controller that, upon failure during initiation of wireless reception of a first decode attempt using a plurality of wirelessly received frames, retains a portion of the received frames for a second decode attempt using the retained portion of the received frames and at least one additional wirelessly received frame.

2. The portion of a wireless receiver according to claim 1, wherein the retained portion of the received frames is a second of two received frames.

3. The portion of a wireless receiver according to claim 2, wherein the at least one additional wirelessly received frame is a third received frame.

4. The portion of a wireless receiver according to claim 1, wherein the decode controller controls decoding of Bose, Chaudhuri, Hocquenghen (BCH) encoded data transmitted on a wideband code division multiple access (WCDMA) system.

5. The portion of a wireless receiver according to claim 1, wherein failure of the first decode attempt with an initially selected frame alignment triggers selection of different frame alignment for subsequent decoding of wirelessly received multi-frame data segments.

6. The portion of a wireless receiver according to claim 1, wherein the decode controller, upon success of the first decode attempt, continues decoding sets of wirelessly received frames using an initially selected frame alignment.

7. A wireless receiver including the portion according to claim 1.

8. A wireless communications system including the wireless receiver according to claim 7.

9. A method of decoding wirelessly received frames comprising:
    upon failure during initiation of wireless reception of a first decode attempt using a plurality of wirelessly received frames, retaining a portion of the received frames for a second decode attempt using the retained portion of the received frames and at least one additional wirelessly received frame.

10. The method according to claim 9, further comprising:
    retaining a second of two received frames.

11. The method according to claim 10, further comprising:
    performing the second decode attempt using a third received frame.

12. The method according to claim 9, further comprising:
    decoding Bose, Chaudhuri, Hocquenghen (BCH) encoded data transmitted on a wideband code division multiple access (WCDMA) system.

13. The method according to claim 9, further comprising:
    upon failure of the first decode attempt with an initially selected frame alignment, selecting different frame alignment for subsequent decoding of wirelessly received multi-frame data segments.

14. The method according to claim 9, further comprising:
    upon success of the first decode attempt, decoding sets of wirelessly received frames using an initially selected frame alignment.

15. A system for decoding wirelessly received data comprising:
    an input buffer storing wirelessly received frames;
    a digital signal processor decoding sets of frames from the input buffer; and a decode controller controlling sets of frames from the input buffer operated on by the digital signal processor, wherein the decode controller, upon failure of a first decode attempt by the digital signal processor on a first frame set having an initial frame alignment, triggers a second decode attempt by the digital signal processor on a second frame set overlapping the first frame set and having a different frame alignment.

16. The system according to claim 15, wherein the input buffer stores at least two wirelessly received frames, and wherein the first and second frame sets each include a second of first and second received frames.

17. The system according to claim 16, wherein the second frame set including the second received frame and a third received frame.

18. The system according to claim 15, wherein the digital signal processor performs decoding of Bose, Chaudhuri, Hocquenghen (BCH) encoded data transmitted on a wideband code division multiple access (WCDMA) system.

19. The system according to claim 15, wherein the initial frame alignment is determined by the decode controller to be incorrect based upon failure of a parity check on the first decode attempt.

20. The system according to claim 15, wherein the initial frame alignment is determined by the decode controller to be correct based upon success of a parity check on the first decode attempt.

* * * * *